United States Patent
Lee et al.

(10) Patent No.: US 12,191,881 B2
(45) Date of Patent: Jan. 7, 2025

(54) ANALOG-TO-DIGITAL CONVERTER AND ANALOG-TO-DIGITAL CONVERSION METHOD USING THE SAME

(71) Applicant: Samsung Electronics Co., Ltd., Suwon-si (KR)

(72) Inventors: Jae Hoon Lee, Suwon-si (KR); Yong Lim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 183 days.

(21) Appl. No.: 18/150,636

(22) Filed: Jan. 5, 2023

(65) Prior Publication Data

US 2023/0231571 A1 Jul. 20, 2023

(30) Foreign Application Priority Data

Jan. 10, 2022 (KR) .......................... 10-2022-0003406
Mar. 11, 2022 (KR) .......................... 10-2022-0030799

(51) Int. Cl.
*H03M 1/82* (2006.01)
*H03M 1/18* (2006.01)
*H03M 1/46* (2006.01)

(52) U.S. Cl.
CPC ........... *H03M 1/825* (2013.01); *H03M 1/182* (2013.01); *H03M 1/462* (2013.01)

(58) Field of Classification Search
CPC ............. H03M 1/18; H03M 1/46; H03M 1/82
See application file for complete search history.

(56) References Cited

U.S. PATENT DOCUMENTS

| | | | |
|---|---|---|---|
| 5,006,853 A | 4/1991 | Kiriaki et al. | |
| 5,321,402 A * | 6/1994 | Matsuzawa | H03M 1/165 330/252 |
| 6,331,833 B1* | 12/2001 | Naviasky | H03M 3/366 341/118 |
| 6,429,799 B1* | 8/2002 | Kamas | H03M 1/127 341/122 |
| 6,590,518 B1* | 7/2003 | Taft | H03M 1/144 341/120 |
| 6,633,249 B1* | 10/2003 | Whittaker | H03M 1/1047 341/158 |
| 7,372,391 B1* | 5/2008 | Courcy | H03M 1/129 341/161 |

(Continued)

*Primary Examiner* — Lam T Mai
(74) *Attorney, Agent, or Firm* — Harness, Dickey & Pierce, P.L.C.

(57) ABSTRACT

An analog-to-digital converter (ADC) includes a first comparator configured to generate a first comparison signal on a basis of a first asynchronous clock signal generated from a sampling clock signal, and a second comparator configured to generate a second comparison signal on a basis of a second asynchronous clock signal generated by a first comparison operation completion signal. The ADC includes a first control logic configured to output a first control signal on a basis of the first comparison signal and a second control logic configured to output a second control signal on a basis of the second comparison signal. The ADC includes a first reference signal adjusting circuit configured to adjust a first reference signal on a basis of the first control signal and a second reference signal adjusting circuit configured to adjust a second reference signal on a basis of the second control signal.

20 Claims, 6 Drawing Sheets

(56) References Cited

U.S. PATENT DOCUMENTS

| | | | |
|---|---|---|---|
| 8,390,501 | B2 | 3/2013 | Chang et al. |
| 9,143,153 | B1 | 9/2015 | Tai et al. |
| 9,331,706 | B1 | 5/2016 | Ranjbar |
| 9,847,790 | B2 | 12/2017 | Liu |
| 10,116,318 | B1* | 10/2018 | Sharif .................. H03M 1/125 |
| 10,256,834 | B1 | 4/2019 | Kinyua |
| 10,284,145 | B2 | 5/2019 | Sun et al. |
| 10,511,319 | B2 | 12/2019 | Kinyua |
| 10,622,899 | B1* | 4/2020 | De Cremoux ... G01R 19/16528 |
| 10,826,502 | B1* | 11/2020 | Badizadegan .......... G06F 30/34 |
| 2006/0119500 | A1* | 6/2006 | Serrano ................ H03M 3/386 |
| | | | 341/155 |
| 2014/0361917 | A1* | 12/2014 | Matsuno ................ G01R 19/10 |
| | | | 341/155 |
| 2015/0365098 | A1* | 12/2015 | Patil ........................ H03K 5/24 |
| | | | 341/155 |
| 2016/0087644 | A1* | 3/2016 | Field ...................... H03M 1/42 |
| | | | 341/161 |
| 2017/0011806 | A1* | 1/2017 | Gangasani ........... H03K 3/0231 |
| 2017/0093283 | A1* | 3/2017 | Leoncini ................. H02M 1/44 |
| 2021/0226643 | A1* | 7/2021 | Moon ................ H03M 1/0695 |
| 2021/0234548 | A1* | 7/2021 | Tangirala .............. H03M 1/468 |
| 2021/0266006 | A1 | 8/2021 | Lin et al. |
| 2023/0163778 | A1* | 5/2023 | Cho ..................... H03M 1/462 |
| | | | 341/161 |

\* cited by examiner

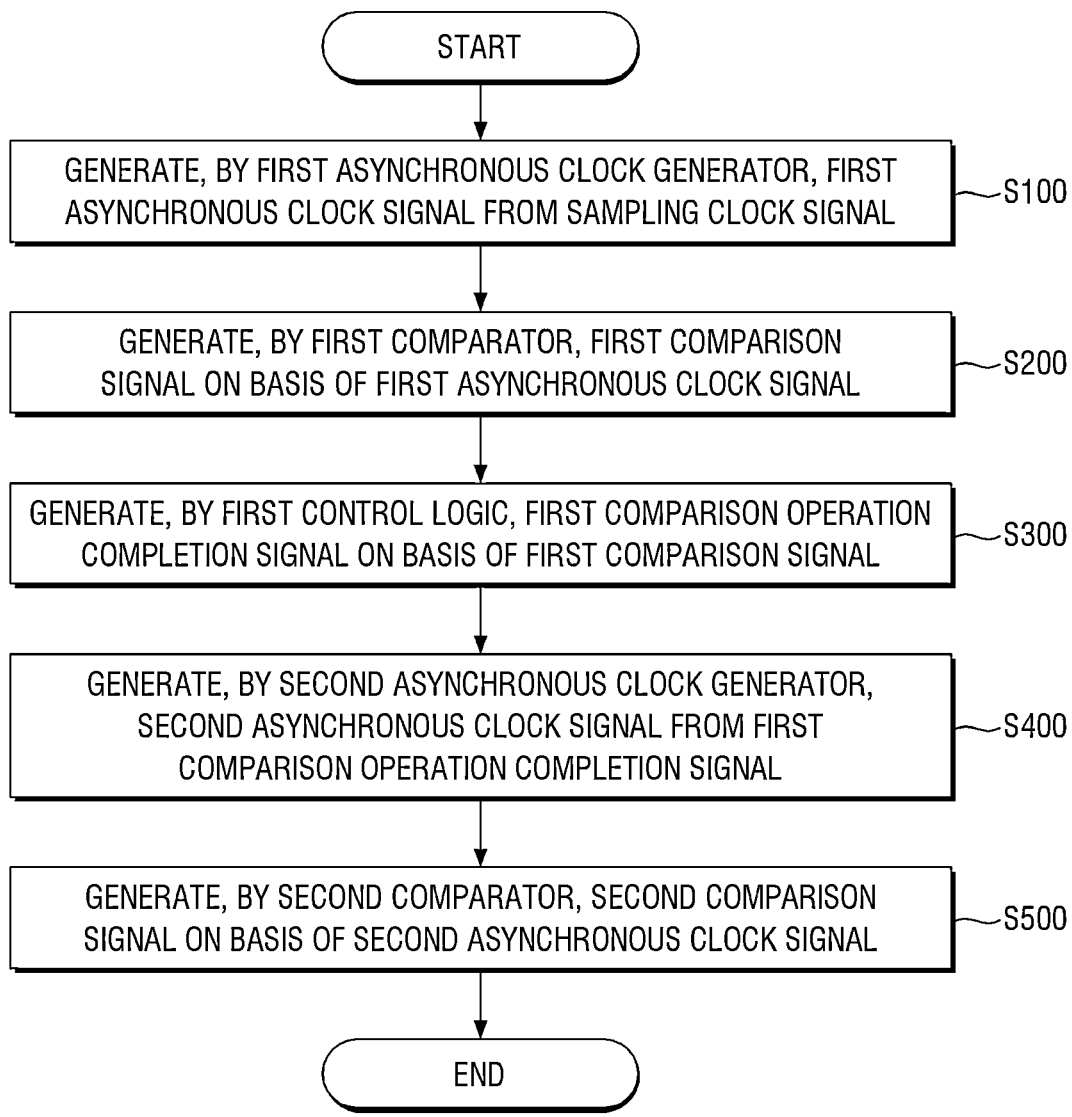

ANALOG-TO-DIGITAL CONVERTER AND ANALOG-TO-DIGITAL CONVERSION METHOD USING THE SAME

This application claims priority from Korean Patent Application No. 10-2022-0003406 filed on Jan. 10, 2022, and Korean Patent Application No. 10-2022-0030799 filed on Mar. 11, 2022, in the Korean Intellectual Property Office, and all the benefits accruing therefrom under 35 U.S.C. 119, the contents of which in their entirety are herein incorporated by reference.

BACKGROUND

Some example embodiments relate to an analog-to-digital converter and/or an analog-to-digital conversion method using the same.

An analog-to-digital converter (ADC) may be used to generate a sequence of digital codes representing signal levels of analog signals.

As one type of such an ADC, there is a successive-approximation register (SAR) ADC that repeatedly performs analog-to-digital conversion to compare data and determine bits of a digital code.

The ADC consumes a large amount of power in a process of converting signals.

SUMMARY

Aspects of the inventive concepts provide an analog-to-digital converter with reduced operational power consumption.

According to an example embodiment of the inventive concepts, an analog-to-digital converter (ADC) includes a first comparator configured to generate a first comparison signal on a basis of a first asynchronous clock signal generated from a sampling clock signal, and a second comparator configured to generate a second comparison signal on a basis of a second asynchronous clock signal generated by a first comparison operation completion signal. The ADC includes a first control logic configured to output a first control signal on a basis of the first comparison signal and a second control logic configured to output a second control signal on a basis of the second comparison signal. The ADC includes a first reference signal adjusting circuit configured to adjust a first reference signal on a basis of the first control signal and a second reference signal adjusting circuit configured to adjust a second reference signal on a basis of the second control signal.

According some example embodiments of the inventive concepts, an analog-to-digital converter (ADC) includes a coarse ADC including a first capacitor array configured to determine N upper bits of a digital output signal corresponding to an analog input signal, a first comparator configured to receive a first asynchronous clock signal generated from a sampling clock signal to output a first comparison signal, and a first successive-approximation register (SAR) logic configured to generate a first comparison operation completion signal on a basis of the first comparison signal. The ADC includes a fine ADC including a second capacitor array configured to determine N-n lower bits remaining after the digital output signal is generated, a second comparator configured to receive a second asynchronous clock signal generated by the first comparison operation completion signal to output a second comparison signal, and a second SAR logic configured to generate a second comparison operation completion signal on a basis of the second comparison signal.

Aspects of the inventive concepts provide an analog-to-digital conversion method using an analog-to-digital converter with reduced operational power consumption.

According to example embodiments of the inventive concepts, an analog-to-digital conversion method includes generating, by a first asynchronous clock generator, a first asynchronous clock signal from a sampling clock signal, generating, by a first comparator, a first comparison signal on a basis of the first asynchronous clock signal, and generating, by a first control logic, a first comparison operation completion signal on a basis of the first comparison signal. The method includes generating, by a second asynchronous clock generator, a second asynchronous clock signal from the first comparison operation completion signal, and generating, by a second comparator, a second comparison signal on a basis of the second asynchronous clock signal.

It should be noted that example embodiments are not limited to the above-described objects and other objects of the inventive concepts will be apparent from the following descriptions.

BRIEF DESCRIPTION OF THE DRAWINGS

The above and other aspects and features of the inventive concepts will become more apparent by describing example embodiments thereof in detail with reference to the attached drawings, in which:

FIG. 6 is a diagram for describing an effect of a semiconductor device according to some example embodiments.

DETAILED DESCRIPTION OF SOME EXAMPLE EMBODIMENTS

Hereinafter, some example embodiments according to the inventive concepts will be described with reference to the accompanying drawings.

Figure 1:
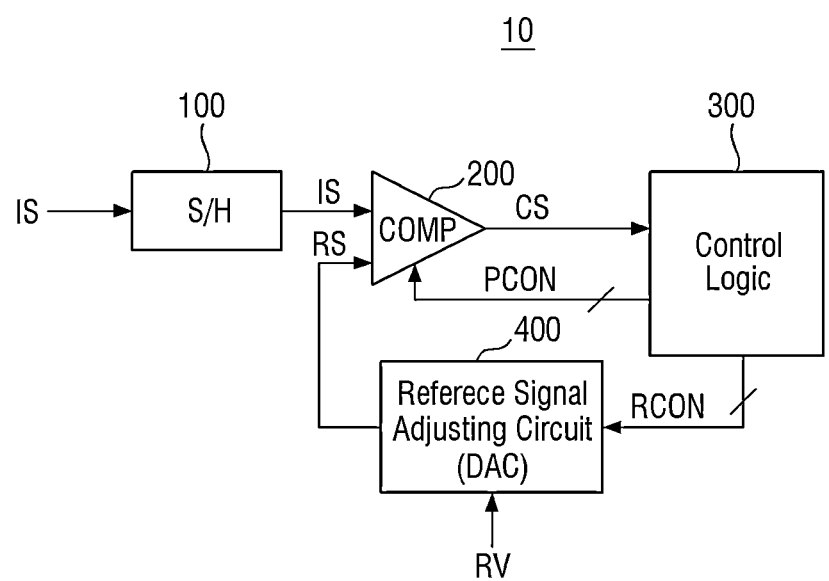
FIG. 1 is a block diagram of a semiconductor device according to some example embodiments.

FIG. 1 is a block diagram of a semiconductor device according to some example embodiments.

Referring to FIG. 1, a semiconductor device 10 may include a sample circuit 100, a comparator 200, a control logic 300, and a reference signal adjusting circuit 400.

In some example embodiments, the semiconductor device 10 may be, for example, an analog-to-digital converter (ADC) that converts an analog input signal IS into a digital signal corresponding thereto. Specifically, the semiconductor device 10 may be, for example, a successive-approximation register (SAR) ADC that converts an analog input signal IS provided through a successive approximation method into a q-bit digital output signal (here, q is a natural number).

Hereinafter, some example embodiments will be described by taking an example of the case in which the semiconductor device 10 is an SAR ADC, but example embodiments are not limited thereto. In some other example embodiments, the semiconductor device 10 may be implemented as a type of ADC other than an SAR ADC, may be implemented as a type of semiconductor device 10 other than an ADC, etc.

Referring to FIG. 1, the sample circuit 100 may receive the input signal IS and sample and hold the received input signal IS. Specifically, the sample circuit 100 may store the input signal IS using a predetermined storage device to provide the input signal IS to the comparator 200.

The comparator 200 may compare the input signal IS with a reference signal RS and output a comparison signal CS on the basis of a result of the comparison. Specifically, the comparator 200 may compare a voltage level of the input signal IS with a voltage level of the reference signal RS and output the comparison signal CS on the basis of a result of the comparison.

When the voltage level of the input signal IS is higher than the voltage level of the reference signal RS, the comparator 200 may output a comparison signal CS having a first level, and when the voltage level of the input signal IS is lower than the voltage level of the reference signal RS, the comparator 200 may output a comparison signal CS having a second level different from the first level. The detailed configuration of the comparator 200 will be described below in more detail.

The control logic 300 may receive the comparison signal CS from the comparator 200 and determine a bit value of the digital signal corresponding to the input signal IS on the basis of the received comparison signal CS. Further, the control logic 300 may receive the comparison signal CS from the comparator 200 and output a first control signal RCON to the reference signal adjusting circuit 400 on the basis of the received comparison signal CS.

The reference signal adjusting circuit 400 may adjust the reference signal RS provided to the comparator 200 according to the first control signal RCON received from the control logic 300. Specifically, the reference signal adjusting circuit 400 may adjust the voltage level of the reference signal RS provided to the comparator 200 according to the first control signal RCON received from the control logic 300.

In some example embodiments, when the semiconductor device 10 is the SAR ADC, the reference signal adjusting circuit 400 may include a digital-to-analog converter (DAC) that adjusts the voltage level of the reference signal RS according to the first control signal RCON, which is a digital signal. Specifically, when the semiconductor device 10 is the SAR ADC, the reference signal adjusting circuit 400 may include a DAC that adjusts a reference voltage RV received from the outside according to the first control signal RCON, which is a digital signal, and outputs the adjusted reference voltage RV as a reference signal RS. More specifically, when the semiconductor device 10 is the SAR ADC, the reference signal adjusting circuit 400 may include a DAC that controls a plurality of capacitors and a plurality of switches disposed therein according to the first control signal RCON, which is a digital signal, to generate a reference signal RS from the reference voltage RV and output the generated reference signal RS to the comparator 200.

Meanwhile, the control logic 300 may provide a second control signal PCON for controlling the operation of the comparator 200 to the comparator 200.

In some example embodiments, the control logic 300 may include an SAR logic, and the reference signal adjusting circuit 400 may include a DAC that generates a reference voltage according to a first control signal RCON received from the SAR logic, but example embodiments are not limited thereto.

Figure 2:
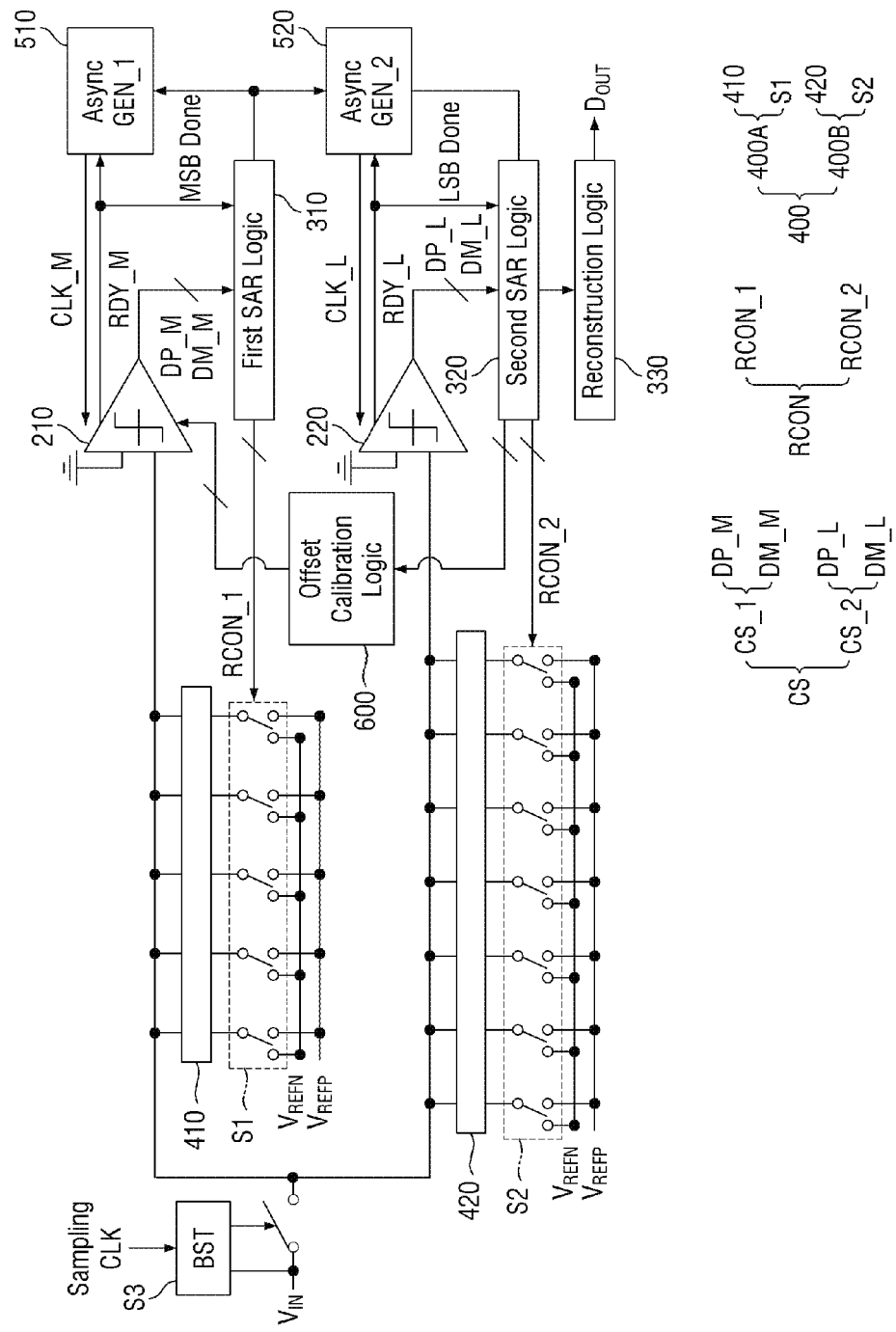
FIG. 2 is a diagram for describing an ADC according to some example embodiments.
Figure 3:
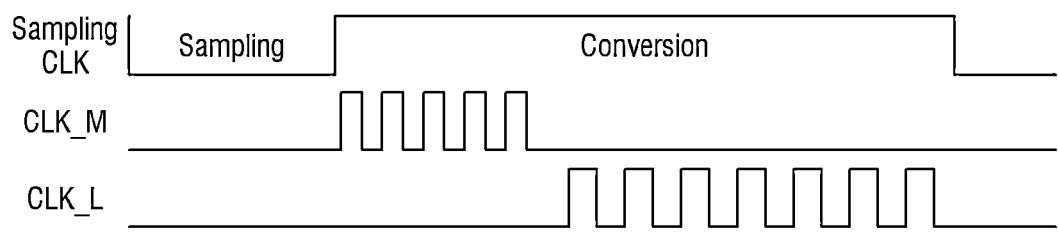
FIG. 3 is a diagram for describing the operation of the ADC of FIG. 2.
Figure 4:
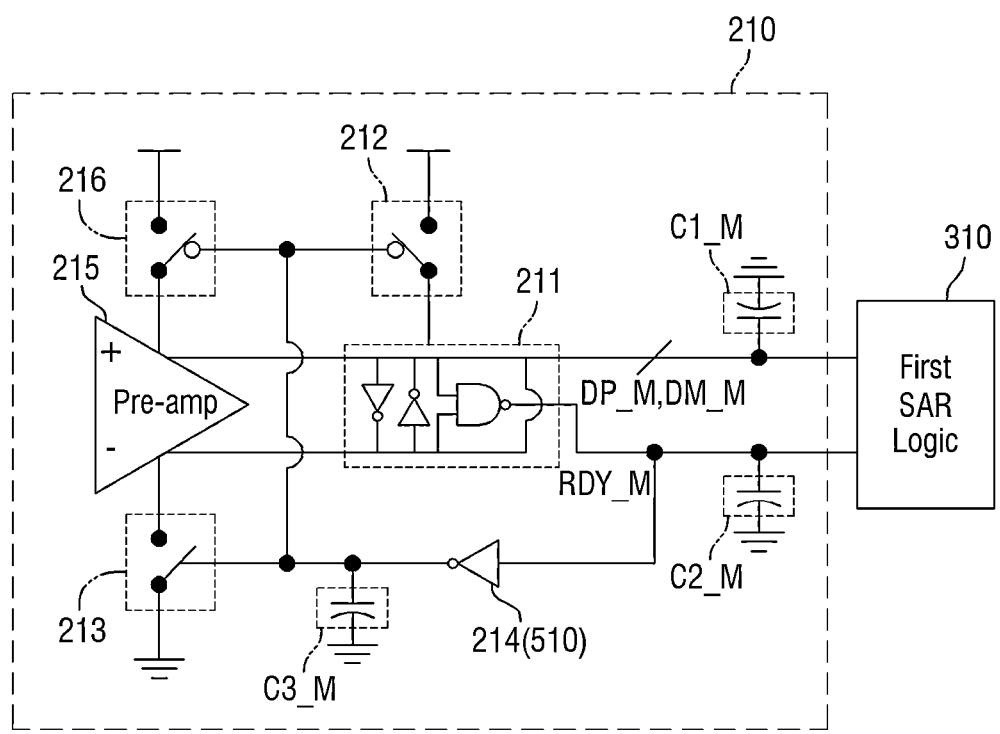
FIG. 4 is a schematic diagram illustrating a first comparator included in the ADC of FIG. 1.
Figure 5:
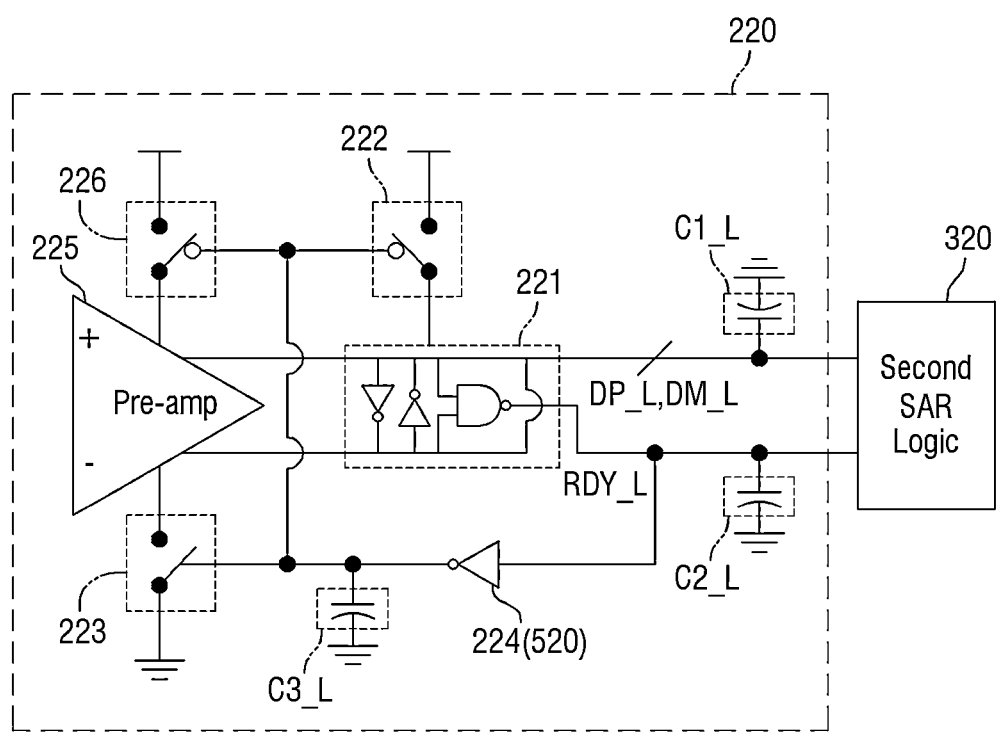
FIG. 5 is a schematic diagram illustrating a second comparator included in the ADC of FIG. 1.

FIG. 2 is a diagram for describing an ADC according to some example embodiments. FIG. 3 is a diagram for describing the operation of the ADC of FIG. 2. FIG. 4 is a schematic diagram illustrating a first comparator included in the ADC of FIG. 1. FIG. 5 is a schematic diagram illustrating a second comparator included in the ADC of FIG. 1.

Referring to FIG. 2, a semiconductor device 10 may further include first and second asynchronous clock generators 510 and 520. The first asynchronous clock generator 510 may receive a sampling clock signal Sampling CLK and generate a first asynchronous clock signal CLK_M from the received sampling clock signal Sampling CLK. The second asynchronous clock generator 520 may generate a second asynchronous clock signal CLK_L from a first comparison operation completion signal MSB_Done.

The comparator 200 may include first and second comparators 210 and 220 that compare an input signal $V_{IN}$ with first and second reference signals to generate first and second comparison signals CS_1 and CS_2, respectively. The first comparator 210 may be a coarse comparator, and the second comparator 220 may be a fine comparator. A coarse ADC may include the coarse comparator 210, a first control logic 310, and the first asynchronous clock generator 510, and a fine ADC may include the fine comparator 220, a second control logic 320, and the second asynchronous clock generator 520.

Referring to FIGS. 2 and 3, the first comparator 210 may generate a first comparison signal CS_1 on the basis of the first asynchronous clock signal CLK_M generated from the sampling clock signal Sampling CLK. The second comparator 220 may generate a second comparison signal CS_2 on the basis of the second asynchronous clock signal CLK_L generated by the first comparison operation completion signal MSB_Done. That is, the first asynchronous clock generator 510 may receive the sampling clock signal Sampling CLK to start generating the first asynchronous clock signal CLK_M, and may stop generating the first asynchronous clock signal CLK_M in response to the first comparison operation completion signal MSB_Done provided by the first control logic 310. Thereafter, the second asynchronous clock generator 520 may start generating the second asynchronous clock signal CLK_L.

The first comparison signal CS_1 may include first up/down signals DP_M and DM_M for performing a first comparison operation, and the second comparison signal CS_2 may include second up/down signals DP_L and DM_L for performing a second comparison operation. The first comparator 210 may provide a first ready signal RDY_M for confirming that the first up/down signals DP_M and DM_M have been transmitted, and the second comparator 220 may provide a second ready signal RDY_L for confirming that the second up/down signals DP_L and DM_L have been transmitted.

In this case, the first comparison signal CS_1 may be synchronized or substantially synchronized with the first asynchronous clock signal CLK_M, and the second comparison signal CS_2 may be synchronized or substantially synchronized with the second asynchronous clock signal CLK_L. The first and second comparison signals CS_1 and CS_2 may not be synchronized with the sampling clock signal Sampling CLK.

A control logic 300 may include the first control logic 310 and the second control logic 320.

The first and second control logics 310 and 320 may respectively output first and second control signals RCON_1 and RCON_2 on the basis of the first and second comparison signals CS_1 and CS_2. Each of the first and second control logics 310 and 320 may determine bits of a digital output signal corresponding to an analog input signal from a corresponding one of the first and second comparators 210 and 220.

The first and second control logics 310 and 320 may respectively output first and second comparison operation completion signals MSB_Done and LSB_Done on the basis of the first and second comparison signals CS_1 and CS_2. The first control logic 310 may generate the first comparison operation completion signal MSB_Done on the basis of the first comparison signal CS_1. The second control logic 320 may generate the second comparison operation completion signal LSB_Done on the basis of the second comparison signal CS_2.

The first control logic 310 may provide the first comparison operation completion signal MSB_Done to the first asynchronous clock generator 510. The second control logic 320 may provide the second comparison operation completion signal LSB_Done to the second asynchronous clock generator 520.

A conversion logic 330 may convert first data output by the first control logic 310 and second data output by the second control logic 320 into digital signals. Digital processing may be performed on both of the first data and the second data, and each of the first data and the second data may be converted into a digital output signal $D_{OUT}$.

A reference signal adjusting circuit 400 may include first and second reference signal adjusting circuits 400A and 400B that adjust voltage levels of the first and second reference signals according to the first and second control signals RCON_1 and RCON_2. The first and second reference signal adjusting circuits 400A and 400B may include first and second capacitor arrays 410 and 420 and a plurality of switches S1 and S2, respectively.

Although not specifically illustrated, each of the first and second capacitor arrays 410 and 420 may include a plurality of binary-weighted capacitors. The first reference signal adjusting circuit 400A may include the first capacitor array 410 used to determine N upper bits of the digital output signal corresponding to the analog input signal. The second reference signal adjusting circuit 400B may include the second capacitor array 420 used to determine N-n lower bits remaining after the digital output signal is generated.

Each of the plurality of capacitors may have the capacitance of $2^n$ times the capacitance of a unit capacitor (or any other suitable capacitance value). For example, each of the capacitors included in the second capacitor array 420 may have the capacitance of $2^0$ times, $2^1$ times, $2^2$ times, $2^3$ times, $2^4$ times, $2^5$ times the capacitance of the unit capacitor, etc. Further, for example, each of the capacitors included in the first capacitor array 410 may have the capacitance of $2^6$ times, $2^7$ times, $2^8$ times, $2^9$ times, $2^{10}$ times the capacitance of the unit capacitor, etc.

The capacitors included in the first capacitor array 410 may be used to receive a first reference voltage $V_{REFP}$ and a second reference voltage $V_{REFN}$ and determine upper bits of the digital output signal $D_{OUT}$. The capacitors included in the second capacitor array 420 may be used to receive the first reference voltage $V_{REFP}$ and the second reference voltage $V_{REFN}$ and determine lower bits of the digital output signal $D_{OUT}$.

First terminals of the capacitors included in the first capacitor array 410 may be connected to a first node of the first comparator 210. First terminals of the capacitors included in the second capacitor array 420 may be connected to a first node of the second comparator 220.

Second terminals of the capacitors included in the first capacitor array 410 may be connected to any one of the first reference voltage $V_{REFP}$ and the second reference voltage $V_{REFN}$ by the plurality of switches S1. Second terminals of the capacitors included in the second capacitor array 420 may be connected to any one of the first reference voltage $V_{REFP}$ and the second reference voltage $V_{REFN}$ by the plurality of switches S2.

For example, the first terminal may be a top plate of the capacitor, and the second terminal may be a bottom plate of the capacitor.

The first and second switches S1 and S2 may be controlled according to the first control signal RCON_1 and the second control signal RCON_2 which are respectively output from the first control logic 310 and the second control logic 320.

A third switch S3 may function as a bootstrap switch. In this case, the ON-resistance of a sampling switch that is changed dependently on the input signal $V_{IN}$ may be constantly changed.

An offset calibration logic 600 may calibrate the bits determined by the first control logic 310 and the bits determined by the second control logic 320.

Referring to FIGS. 4 and 5, the first comparator 210 may include a first preamplifier 215 that primarily amplifies a difference between the input signal $V_{IN}$ and the first reference signal, and a first latch 211 that generates a first comparison signal CS_1 using an output of the first preamplifier 215.

The first comparator 210 may further include a first preamplifier reset switch circuit 216, a first latch reset switch circuit 212, a 1_1 capacitor C1_M connected to a node that provides first up/down signals DP_M and DM_M, a 1_2 capacitor C2_M connected to a node that provides a first ready signal RDY_M, and a 1_3 capacitor C3_M connected to a node connected to the first asynchronous clock generator 510.

The first control logic 310 may provide start and end signals of the operation of the first preamplifier 215 to control the start of the operation of the first preamplifier 215.

The second comparator 220 may include a second preamplifier 225 that secondarily amplifies a difference between the input signal $V_{IN}$ and the second reference signal, and a second latch 221 that generates a second comparison signal CS_2 using an output of the second preamplifier 225.

The second comparator 220 may further include a second preamplifier reset switch circuit 226, a second latch reset switch circuit 222, a 2_1 capacitor C1_L connected to a node that provides second up/down signals DP_L and DM_L, a 2_2 capacitor C2_L connected to a node that provides a second ready signal RDY_L, and a 2_3 capacitor C3_L connected to a node connected to the second asynchronous clock generator 520.

The second control logic 320 may provide start and end signals of the operation of the second preamplifier 225 to control the start of the operation of the second preamplifier 225.

A first comparison operation corresponding to upper bits may be performed by the first comparator 210, and after the first comparison operation is performed, a second comparison operation corresponding to lower bits may be performed by the second comparator 220.

Since the first comparison operation is performed by the coarse comparator 210 and the second comparison operation is performed by the fine comparator 220, an operation speed of the first comparison operation may be greater than an operation speed of the second comparison operation, and the first comparison operation may be performed with less power consumption than the second comparison operation.

Further, an amount of power consumed when the first comparison operation is performed may be smaller than that of power consumed when the second comparison operation is performed. As a result, the sizes of a first tail switch circuit 213, a first asynchronous clock generator 214, the first preamplifier 215, and the first control logic 310 may be reduced compared to prior art. In this case, the size of the first preamplifier 215 may be smaller than the size of the second preamplifier 225, and the size of the first control logic 310 may be smaller than the size of the second control logic 320.

Accordingly, the loading of unwanted parasitic capacitors may also be reduced. As a result, the sizes of the first latch 211, the first latch reset switch circuit 212, and the first asynchronous clock generator 214 may be reduced compared to prior art.

Meanwhile, in this case, the accuracy of the first comparison operation of the first comparator 210 may be lower than the accuracy of the second comparison operation of the second comparator 220. Although not specifically illustrated, errors related to the comparison operations may be removed using, for example, a redundancy circuit of the second reference signal adjusting circuit 400B.

The first comparator 210 may perform the first comparison operation at a fast operation speed with reduced power consumption, and the second comparator 220 may perform the second comparison operation with improved accuracy. That is, the power consumption may be reduced even when the accuracy of the comparison operation is the same or improved compared to prior art. As a result, the sizes of a second tail switch circuit 223 and a second asynchronous clock generator 224 may be reduced.

Accordingly, the loading of the unwanted capacitors may also be reduced. As a result, the sizes of the second latch 221 and the second latch reset switch circuit 222 may be reduced compared to the related art.

FIG. 6 is a flowchart illustrating an analog-to-digital conversion method according to some example embodiments.

First, a first asynchronous clock signal CLK_M may be generated from a sampling clock signal Sampling CLK by a first asynchronous clock generator 510 (S100).

Thereafter, a first comparison signal CS_1 may be generated based on the first asynchronous clock signal CLK_M by a first comparator 210 (S200).

Thereafter, a first comparison operation completion signal MSB_Done may be generated based on the first comparison signal CS_1 by a first control logic 310 (S300).

Thereafter, a second asynchronous clock signal CLK_L may be generated from the first comparison operation completion signal MSB_Done by a second asynchronous clock generator 520 (S400).

Thereafter, a second comparison signal CS_2 may be generated based on the second asynchronous clock signal CLK_L by a second comparator 220 (S500). Thereafter, a second comparison operation completion signal LSB_Done may be generated based on the second comparison signal CS_2 by a second control logic 320.

The first comparison signal CS_1 may include first up/down signals DP_M and DM_M for performing a first comparison operation, and the second comparison signal CS_2 may include second up/down signals DP_L and DM_L for performing a second comparison operation. The first comparator 210 may provide a first ready signal RDY_M for confirming that the first up/down signals DP_M and DM_M have been transmitted, and the second comparator 220 may provide a second ready signal RDY_L for confirming that the second up/down signals DP_L and DM_L have been transmitted.

The first comparison signal CS_1 may be generated according to the first asynchronous clock signal CLK_M, and the second comparison signal CS_2 may be generated according to the second asynchronous clock signal CLK_L. The first and second comparison signals CS_1 and CS_2 may not be synchronized with the sampling clock signal Sampling CLK.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

One or more of the elements disclosed above may include or be implemented in one or more processing circuitries such as hardware including logic circuits; a hardware/software combination such sa a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

While some example embodiments have been described with reference to the accompanying drawings, the inventive concepts are not limited to the example embodiments disclosed but may be implemented in various different forms. It will be understood that various modifications can be made without departing from the scope of the inventive concepts. Therefore, the above-described example embodiments should be considered in a descriptive sense only and not for purposes of limitation.

What is claimed is:

1. An analog-to-digital converter (ADC) comprising:
  a first comparator configured to generate a first comparison signal on a basis of a first asynchronous clock signal generated from a sampling clock signal, and a second comparator configured to generate a second comparison signal on a basis of a second asynchronous clock signal generated by a first comparison operation completion signal;
  a first control logic configured to output a first control signal on a basis of the first comparison signal and a second control logic configured to output a second control signal on a basis of the second comparison signal; and
  a first reference signal adjusting circuit configured to adjust a first reference signal on a basis of the first control signal and a second reference signal adjusting circuit configured to adjust a second reference signal on a basis of the second control signal.

2. The ADC of claim 1, further comprising:
a first asynchronous clock generator configured to generate the first asynchronous clock signal from the sampling clock signal; and
a second asynchronous clock generator configured to generate the second asynchronous clock signal from the first comparison operation completion signal.

3. The ADC of claim 1, wherein:
the first control logic is configured to generate the first comparison operation completion signal on the basis of the first comparison signal; and
the second control logic is configured to generate a second comparison operation completion signal on the basis of the second comparison signal.

4. The ADC of claim 1, wherein:
the first comparator is a coarse comparator; and
the second comparator is a fine comparator.

5. The ADC of claim 1, wherein:
the first reference signal adjusting circuit includes a first capacitor array configured to determine N upper bits of a digital output signal corresponding to an input signal; and
the second reference signal adjusting circuit includes a second capacitor array configured to determine N-n lower bits remaining after the digital output signal is generated.

6. The ADC of claim 1, wherein:
each of the first and second control logics are configured to determine bits of a digital output signal corresponding to an input signal from a corresponding one of the first and second comparators; and
the ADC further includes an offset calibration logic configured to calibrate the bits determined by the first control logic and the bits determined by the second control logic.

7. The ADC of claim 1, wherein:
the first comparator is configured to compare an input signal with the first reference signal to generate the first comparison signal and second comparator is configured to compare the input signal with the second reference signal to generate the second comparison signal;
the first comparator includes a first preamplifier configured to primarily amplify a difference between the input signal and the first reference signal, and a first latch configured to generate the first comparison signal using an output of the first preamplifier;
the second comparator includes a second preamplifier configured to secondarily amplify a difference between the input signal and the second reference signal, and a second latch configured to generate the second comparison signal using an output of the second preamplifier; and
a size of the first preamplifier is smaller than a size of the second preamplifier.

8. The ADC of claim 7, wherein:
the first control logic is configured to control the first preamplifier to start operation of the first preamplifier;
the second control logic is configured to control the second preamplifier to start operation of the second preamplifier; and
a size of the first control logic is smaller than a size of the second control logic.

9. The ADC of claim 1, further comprising a sample circuit configured to receive an input signal, sample and hold the received input signal, and provide the input signal to the first and second comparators.

10. The ADC of claim 9, wherein the ADC includes a successive-approximation register (SAR) ADC.

11. An analog-to-digital converter (ADC) comprising:
a coarse ADC including a first capacitor array configured to determine N upper bits of a digital output signal corresponding to an analog input signal, a first comparator configured to receive a first asynchronous clock signal generated from a sampling clock signal to output a first comparison signal, and a first successive-approximation register (SAR) logic configured to generate a first comparison operation completion signal on a basis of the first comparison signal; and
a fine ADC including a second capacitor array configured to determine N-n lower bits remaining after the digital output signal is generated,
a second comparator configured to receive a second asynchronous clock signal generated by the first comparison operation completion signal to output a second comparison signal, and a second SAR logic configured to generate a second comparison operation completion signal on a basis of the second comparison signal.

12. The ADC of claim 11, wherein:
the coarse ADC further includes a first asynchronous clock generator configured to generate the first asynchronous clock signal from the sampling clock signal; and
the fine ADC further includes a second asynchronous clock generator configured to generate the second asynchronous clock signal from the first comparison operation completion signal.

13. The ADC of claim 12, wherein:
the first SAR logic is configured to provide the first comparison operation completion signal to the first asynchronous clock generator; and
the second SAR logic is configured to provide the second comparison operation completion signal to the second asynchronous clock generator.

14. The ADC of claim 11, wherein:
the first comparison signal is output according to the first asynchronous clock signal; and
the second comparison signal is output according to the second asynchronous clock signal.

15. The ADC of claim 11, wherein:
the first comparator is configured to compare an input signal with a first reference signal to generate the first comparison signal and the second comparator is configured to compare the input signal with a second reference signal to generate the second comparison signal;
the first comparator includes a first preamplifier configured to primarily amplify a difference between the input signal and the first reference signal, and a first latch configured to generate the first comparison signal using an output of the first preamplifier;
the second comparator includes a second preamplifier configured to secondarily amplify a difference between the input signal and the second reference signal, and a second latch configured to generate the second comparison signal using an output of the second preamplifier; and
a size of the first preamplifier is smaller than a size of the second preamplifier.

16. The ADC of claim 15, wherein:
the first SAR logic is configured to control the first preamplifier to start operation of the first preamplifier;

the second SAR logic is configured to control the second preamplifier to start operation of the second preamplifier; and a size of the first SAR logic is smaller than a size of the second SAR logic.

17. An analog-to-digital conversion method comprising:

generating, by a first asynchronous clock generator, a first asynchronous clock signal from a sampling clock signal;

generating, by a first comparator, a first comparison signal on a basis of the first asynchronous clock signal;

generating, by a first control logic, a first comparison operation completion signal on a basis of the first comparison signal;

generating, by a second asynchronous clock generator, a second asynchronous clock signal from the first comparison operation completion signal; and generating, by a second comparator, a second comparison signal on a basis of the second asynchronous clock signal.

18. The analog-to-digital conversion method of claim 17, further comprising generating, by a second control logic, a second comparison operation completion signal on a basis of the second comparison signal.

19. The analog-to-digital conversion method of claim 18, wherein:

bits of a digital output signal corresponding to an input signal from the first comparator are determined by the first control logic, and bits of a digital output signal corresponding to an input signal from the second comparator are determined by the second control logic; and the bits determined by the first control logic and the bits determined by the second control logic are calibrated by a calibration logic.

20. The analog-to-digital conversion method of claim 17, wherein:

the first comparator performs a coarse comparison operation; and the second comparator performs a fine comparison operation.

\* \* \* \* \*